United States Patent [19]
Grabbe

[11] Patent Number: 5,816,482
[45] Date of Patent: Oct. 6, 1998

[54] METHOD AND APPARATUS FOR ATTACHING BALLS TO A SUBSTRATE

[75] Inventor: Dimitry Grabbe, Middletown, Pa.

[73] Assignee: The Whitaker Corporation, Wilmington, Del.

[21] Appl. No.: 638,031

[22] Filed: Apr. 26, 1996

[51] Int. Cl.⁶ .............................. B23K 3/047; H01L 21/60
[52] U.S. Cl. .............................. 228/212; 228/44.7; 269/8; 29/879; 219/616
[58] Field of Search ................................... 228/212, 44.7, 228/49.5, 180.22; 29/879; 269/8, 903; 219/616; 118/500

[56] References Cited

U.S. PATENT DOCUMENTS

| | | | |
|---|---|---|---|
| 3,061,919 | 11/1962 | Tack | 269/8 |
| 4,346,516 | 8/1982 | Yokouchi et al. | 29/845 |
| 4,431,891 | 2/1984 | Forstner et al. | 219/9.5 |
| 4,489,923 | 12/1984 | Barresi et al. | 269/8 |
| 4,871,110 | 10/1989 | Fukasawa et al. | 228/245 |
| 5,118,027 | 6/1992 | Braun et al. | 228/180.2 |
| 5,205,896 | 4/1993 | Brown et al. | 156/297 |
| 5,255,839 | 10/1993 | da Costa Alves et al. | 228/180.21 |
| 5,431,332 | 7/1995 | Kirby et al. | 228/246 |
| 5,435,482 | 7/1995 | Variot et al. | 228/254 |
| 5,504,277 | 4/1996 | Danner | 174/261 |
| 5,578,126 | 11/1996 | Taga et al. | 269/8 |

*Primary Examiner*—Samuel M. Heinrich
*Attorney, Agent, or Firm*—Salvatore Anastasi

[57] ABSTRACT

The present invention is directed to an apparatus and method for attaching balls to a substrate for forming a ball grid array. The apparatus consists of two pole pieces, a magnetizing coil, and an excitation coil. The first pole piece has an alignment plate having a plurality of openings, and a plurality of tips which can be magnetized by the magnetizing coil to attract a ball into each opening. Once the balls are attracted into the openings, excess balls are removed and the substrate is aligned with the balls such that each ball is in contact with a respective pad on the substrate. The first pole piece having the balls and substrate position thereon is then placed into a receiving area of the second piece. An excitation coil is excited with a high frequency signal to heat the balls and reflow solder that has been previously applied thereto. The assembly is then cooled and removed from the device and the ball grid array is complete.

24 Claims, 7 Drawing Sheets

METHOD AND APPARATUS FOR ATTACHING BALLS TO A SUBSTRATE

FIELD OF THE INVENTION

The present invention relates to a method and apparatus for attaching balls to pads on a substrate.

BACKGROUND OF THE INVENTION

In order to achieve a high density of electrical contacts over a small area of a substrate containing for example a semiconductor chip, the electronics industry has moved towards applying balls to the bottom of the substrate in order to form a ball grid array (BGA). Due to the high density of electrical connections between the balls and the contact pads on the substrate, positioning and attaching the balls require high accuracy. Previously, robot arms were used to pick and place hundreds and sometimes thousands of balls onto the pads of the substrate. The robot arm was also used for fluxing as well as accurate placement of each ball onto the pads.

More cost effective methods of ball placement have been developed which apply vacuum technology. U.S. Pat. No. 4,871,110 to Fukasawa, et al. discloses a method and apparatus for aligning solder balls. This patent teaches a method of supplying solder balls on an aligning plate having through holes formed therein and drawing a vacuum from the bottom of the aligning plate to force the solder balls to fit into, and adhere to the through holes. Once the solder balls are positioned in the through holes of the aligning plate, excess solder balls are removed from the top surface of the plate with a brush or the like. The aligning plate having the balls inserted therein may then be moved into position for adhering to the pads of a substrate.

U.S. Pat. No. 5,431,332 to Kirby, et al. discloses a similar aligning plate or stencil which is placed over the substrate such that the openings of the stencil are aligned with the pads on the substrate. The balls are then spread over the stencil until all of the openings are filled and air is blown over the top of the stencil to remove the excess balls. A vibration device may also be coupled to the substrate and stencil to urge the solder balls into the openings of the stencil.

All of these methods require a heating step after the balls are positioned over the pads of the substrate to adhere the balls to the pads for example by reflow soldering. The heating step is generally performed such that the entire assembly including the substrate, balls and pads are all heated to a sufficient temperature for reflowing the solder. The temperature required for reflowing of the solder is often in excess of the operating temperature of any device included on the substrate. As a result, a problem exists in that the heating may damage or degrade the devices or components on the substrate. It is therefore desirable to heat the solder for reflowing in a very localized manner such that no damage results to the devices on the substrate. Since the entire substrate is heated while reflowing the solder, it may warp during a cycle of heating and cooling. This presents a problem in that the substrate will not fit into the end application if it is warped. Also in all of these known methods, the final ball position is controlled by surface tension during the reflowing of solder. Since the balls are loosely held over the pads using a stencil, surface tension during reflowing will tend to move the balls to a balanced position on each of the pads. This may result in variances in ball positioning or location. These variances present a problem with terminating the ball grid array in the final application.

SUMMARY OF THE INVENTION

It is therefore the object of this invention to provide a simple method and apparatus for accurately positioning and attaching balls to respective pads of a substrate. This object is achieved by providing an apparatus having a first pole piece which can be energized to magnetically attract balls into openings of a plate. A second pole piece, having a receiving area for the first pole piece is then exited to rapidly raise the temperature of the balls by inducing eddy currents therein. The heating causes solder between the pads and balls to reflow. This apparatus therefore performs both accurate positioning of the balls and attachment by reflow soldering.

BRIEF DESCRIPTION OF THE DRAWINGS

The invention will now be described by way of example with reference to the accompanying drawings of which.

DETAILED DESCRIPTION OF THE INVENTION

Figure 1:
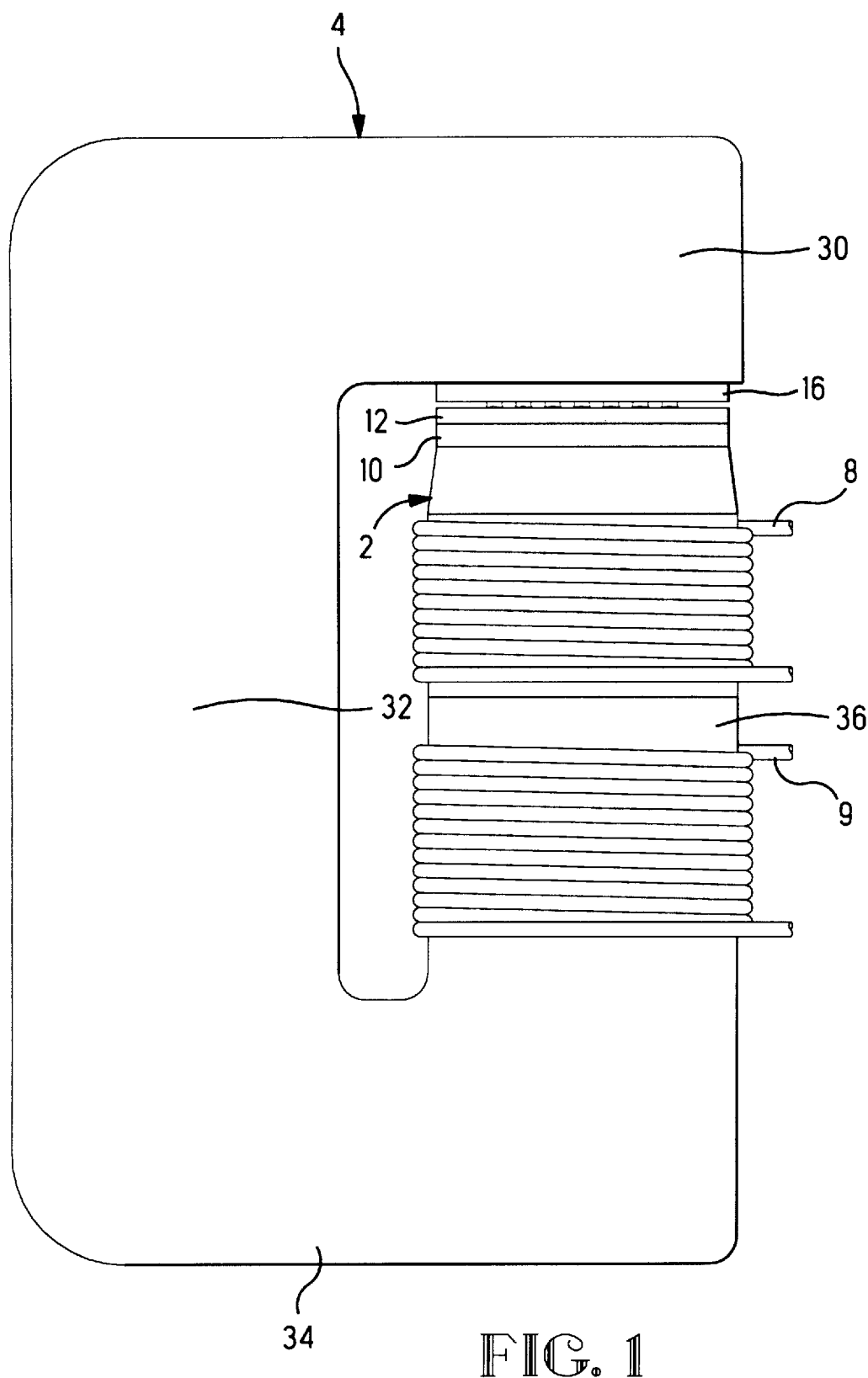
FIG. 1 shows a side view of the apparatus according to this invention.

The apparatus 1 as shown in FIG. 1 consists of a ferrite pole piece 2 having a plurality of tapered sections 6, which fit into openings of the insulative base plate 10. An alignment plate 12 is placed over the insulative base plate 10 such that ball receiving openings 20 in the alignment plate 12 are aligned with tips 7 of each tapered section 6. In order to secure the insulative base plate 10 to the ferrite pole piece 2, an epoxy, resin, or adhesive 11 may be used to fill the area between the ferrite pole piece 2 and the insulative base plate 10. The ferrite pole piece 2 has a magnetizing coil 8 wrapped around its periphery and a second ferrite pole piece is profiled to receive the ferrite pole piece 2 and has an excitation coil 9 wrapped around a portion of its periphery.

Figure 2:
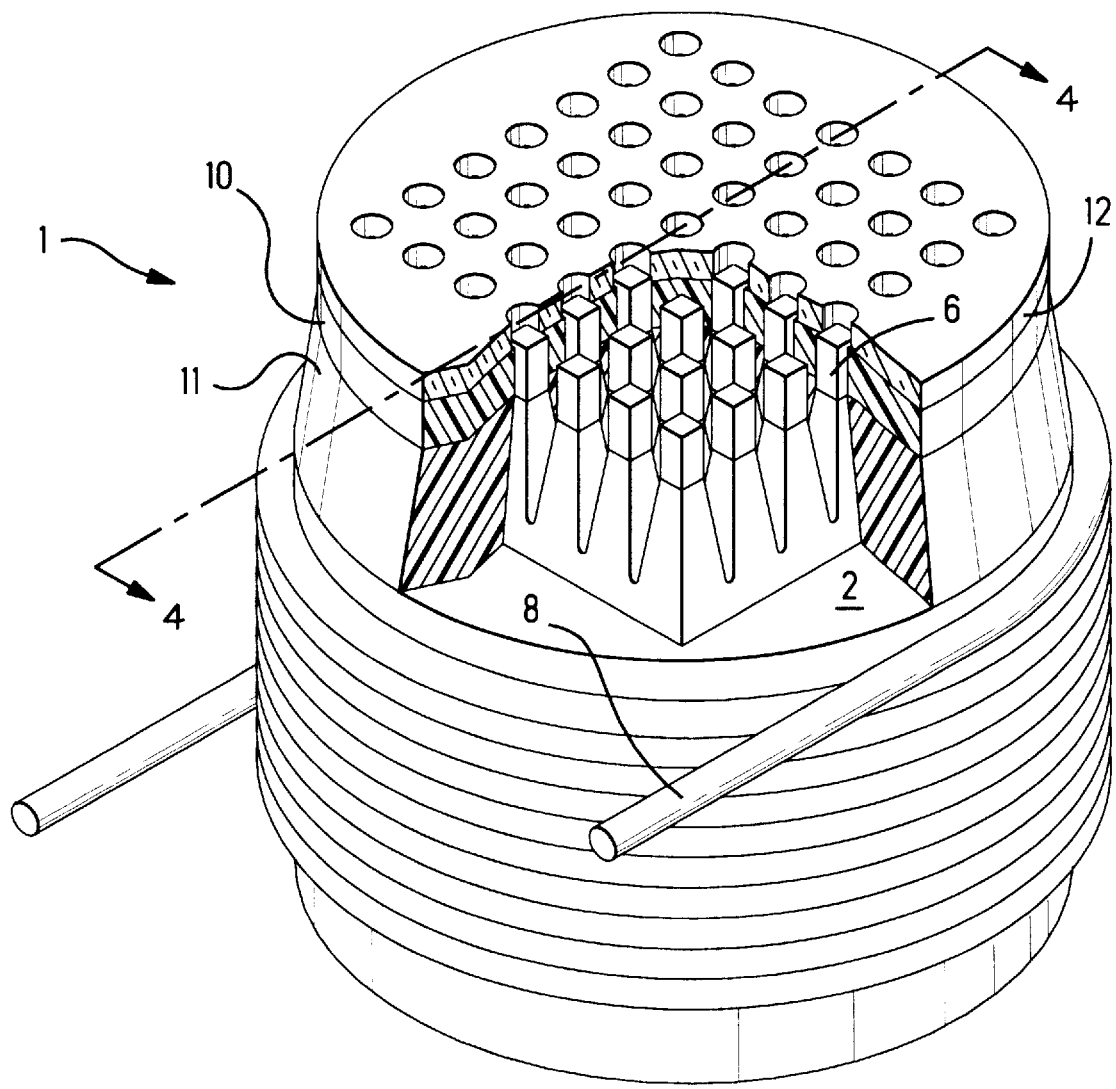
FIG. 2 shows a 3-dimensional view of the first pole piece.
Figure 3:
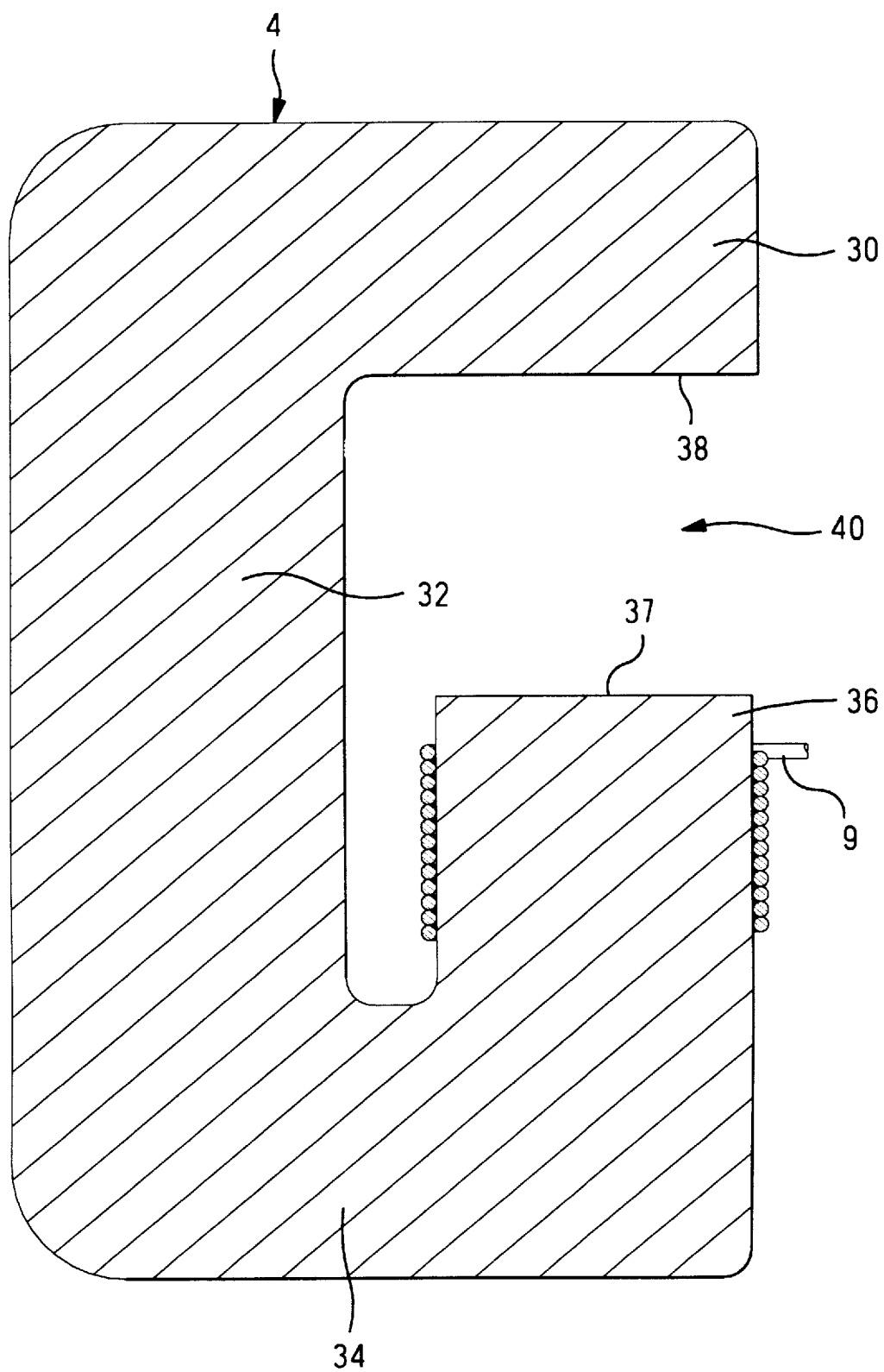
FIG. 3 shows a cross sectional view of the second pole piece.

Referring to FIGS. 1 to 3, the major components of the apparatus will now be described:

First the pole piece 2 (FIG. 2) is machined from a block of ferrite such that it has a cylindrical main body 5 and tapered sections 6, each having a tip 7 extending therefrom. A magnetizing coil 8 is wrapped around the outer periphery of the first pole piece main body 5. An insulative base plate 10 is then placed over the tips 7 for supporting an alignment plate 12 and may be secured to the tips 7 by an adhesive 11 or other appropriate material such as an epoxy or a resin. Each tip 7 passes through a respective opening in the insulative base plate 10. Finally, an alignment plate 12 is placed over the insulative base plate 10 and fixed thereto such that ball receiving openings 20 of the alignment plate 12 are correspondingly aligned to have each tip 7 pass through a respective ball receiving opening 20. Each ball receiving opening 20 has a diameter which is slightly larger than the diameter of the ball 14 which is to be received by the ball receiving opening 20.

A second pole piece 4 (FIG. 3) is machined from a ferrite material such that it is generally "G" shaped as viewed from the side and cylindrical in cross section having a diameter substantially equal to that of the main body 5 of the ferrite pole piece 2. The "G" shape of the second pole piece 4 is defined by an upper arm 30, a major arm 32, a base 34 and a minor arm 36. An opening 40 between the minor arm 36 and the upper arm 30 is profiled to receive the first pole piece 2 having balls 14 and the substrate 16 mounted thereon in preparation for soldering. An excitation coil 9 is wrapped around the periphery of the minor arm 36.

Figure 4:
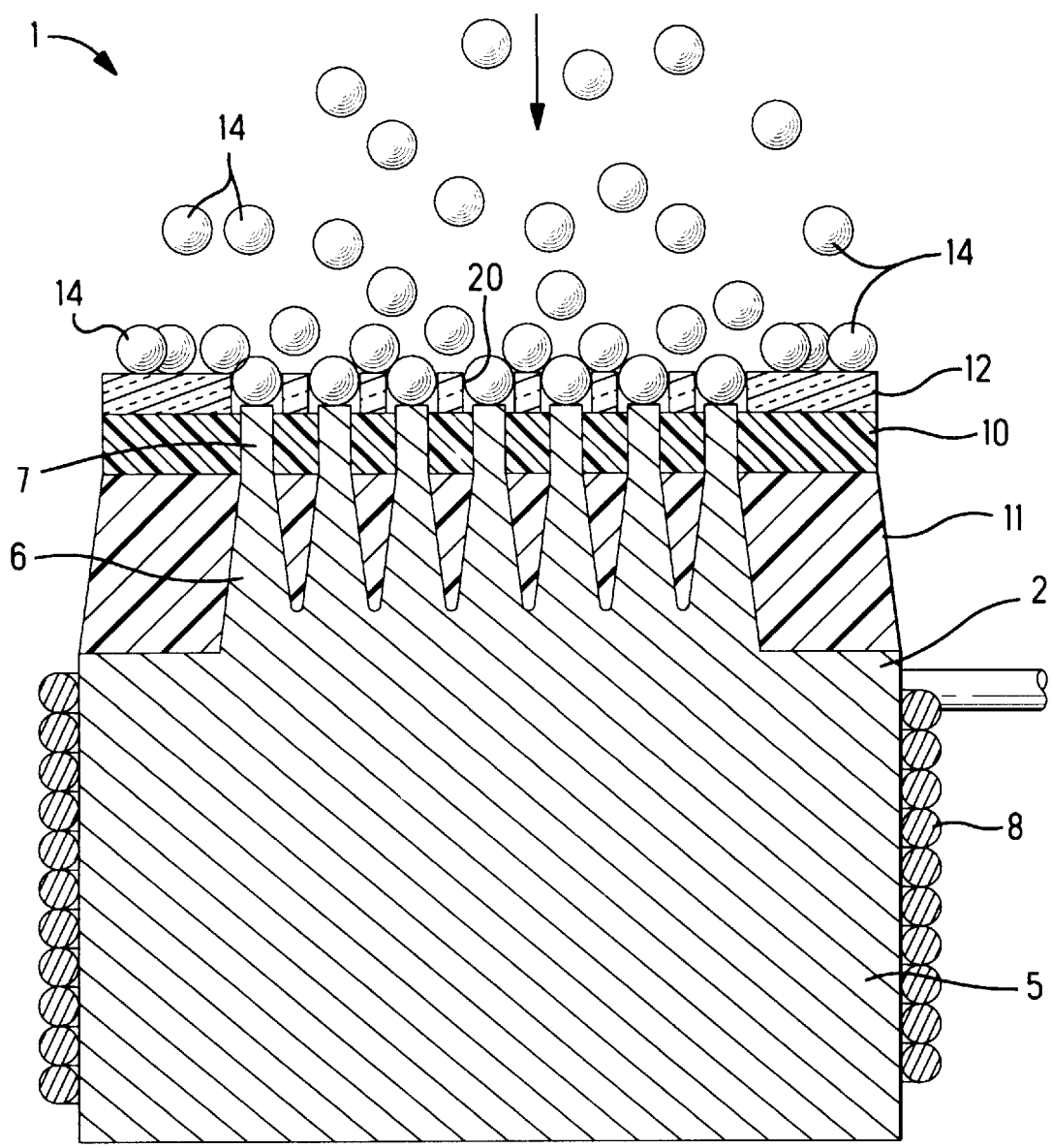
FIG. 4 shows a cross sectional view of the apparatus taken along the line 4,4 of FIG. 2, as the holes are being populated.
Figure 5:
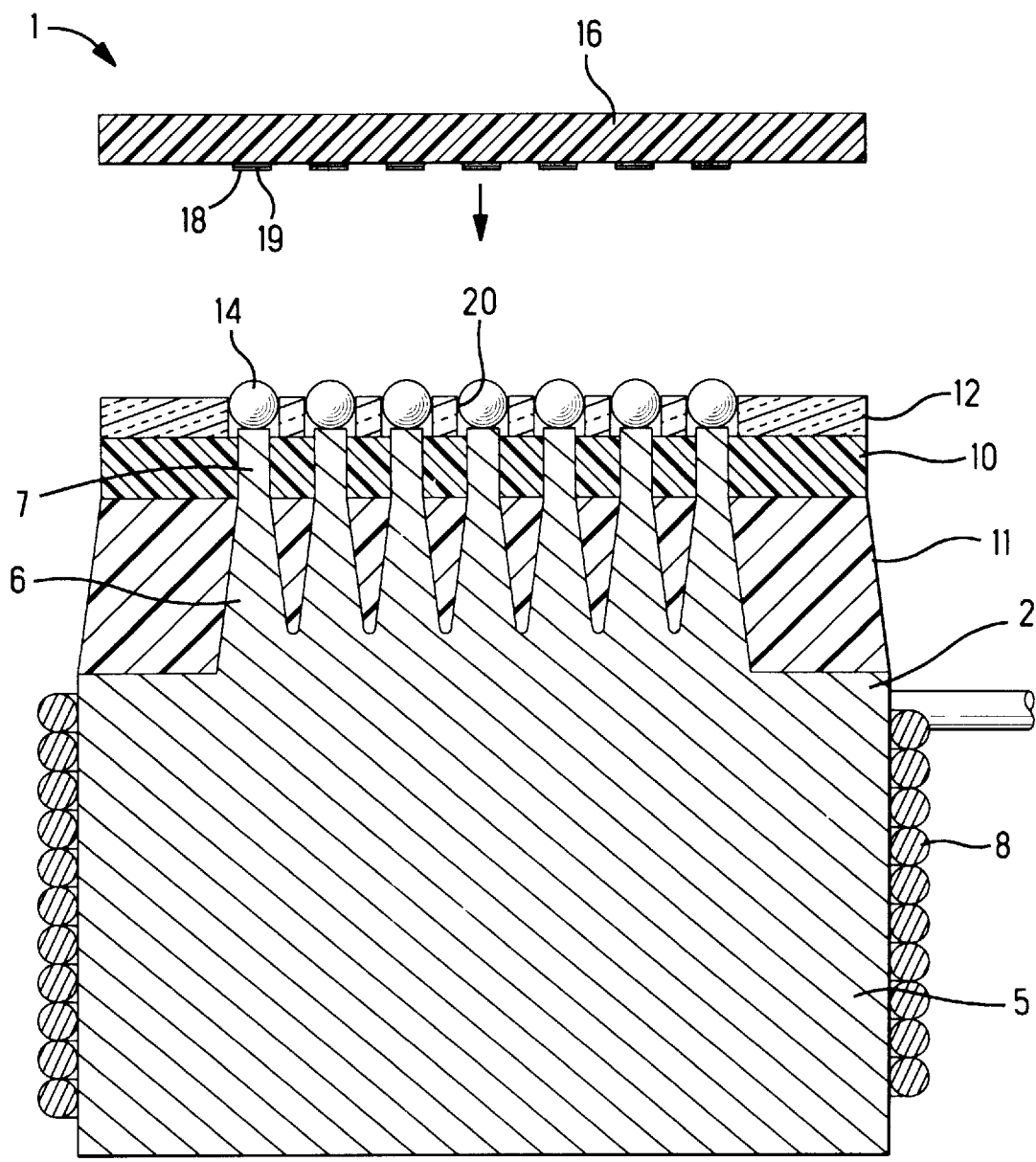
FIG. 5 shows a cross sectional view similar to FIG. 4 after excess balls have been removed and the substrate is being positioned for ball attachment.
Figure 6:
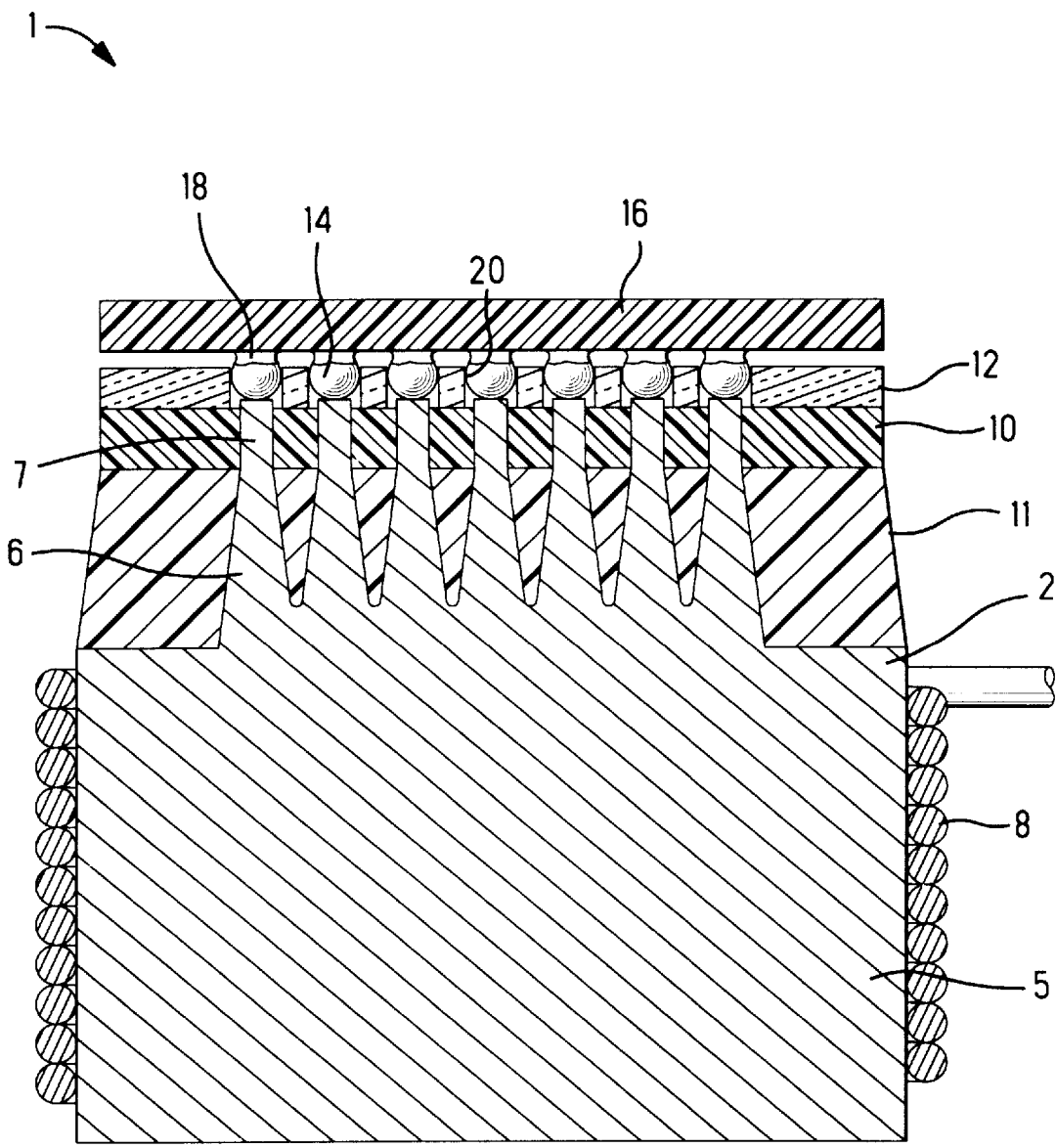
FIG. 6 shows a cross sectional view of the apparatus similar to FIG. 4, after attachment of the balls to the substrate.

The method of attaching balls 14 to a substrate using this apparatus 1 will now be described. First the magnetizing coil 8 is energized so that a magnetic field is produced about each tip 7. It is worth noting that this magnetic field could also be produced by other acceptable means such as by applying a magnet to the pole piece instead of using a magnetizing coil 8. Referring to FIG. 4, the apparatus 1 is then populated with the plurality of balls 14 which are randomly dropped on to or spread over the apparatus 1 and the magnetic field about each tip 7 attracts a single ball 14 into each ball receiving opening 20 of the alignment plate 12. Excess balls 14 are removed from the apparatus 1 by either vibrating, blowing, or sweeping. A substrate 16 is brought into contact with the balls 14 such that each ball 14 is aligned with a corresponding pad 19 on the substrate 16 (FIG. 5). The pads 19 or balls 14 have been prefluxed and solder pasted. The ferrite pole piece 2 having balls and the substrate positioned thereon is then inserted into the opening 40 of the second ferrite pole piece 4. All of the major components of the assembly are now in position for reflowing the solder 18 in order to connect the balls 14 to the pads 19. The magnetizing coil 8 is then deenergized and the second ferrite pole piece 4 is excited, causing eddy currents in each ball 14 and quickly heating each ball 14 to a desired temperature for reflowing the solder 18 that was previously applied to the pad 19. The excitation is accomplished by applying a high frequency signal to the excitation coil 9, producing a magnetic field in the pole piece 4 and inducing eddy currents in the balls 14. Note that the second pole piece 4 is "G" shaped to provide a closed loop for the magnetic flux lines. This heating method has been shown to produce a soldering cycle which results in a very localized heating around each ball 14 and can be accomplished in less than one second. It should be noted that the localized heating is accomplished through heating balls 14 instead of heating the entire assembly. The substrate therefore remains virtually at room temperature preventing degradation of the devices contained thereon or warpage of the substrate. Finally, the substrate and ball assembly or ball grid array is then cooled and removed from the apparatus 1.

Figure 7:
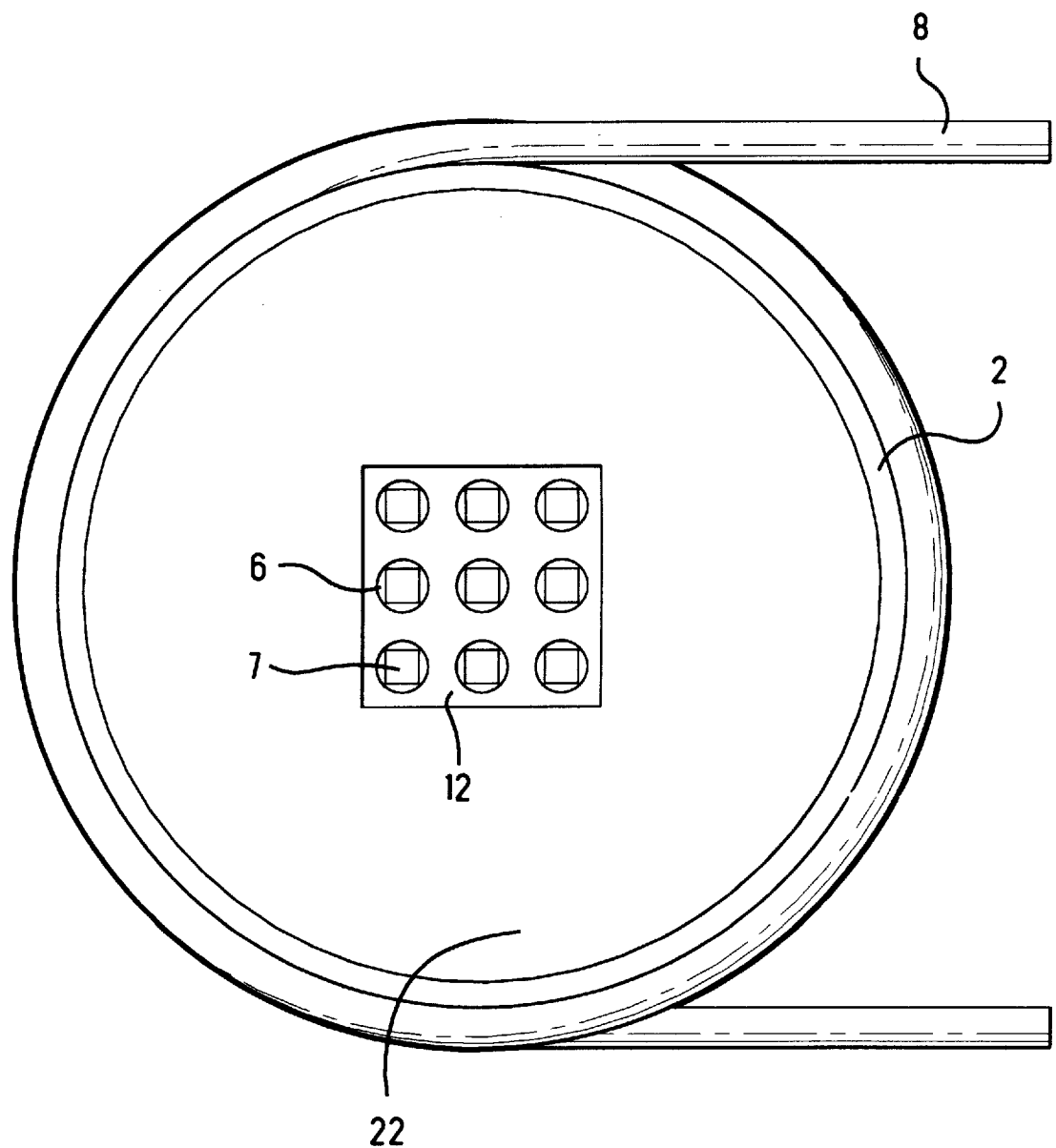
FIG. 7 shows a top view of the apparatus with a mask applied thereto for forming smaller sizes of ball grid arrays.

This apparatus 1 has been shown here by example having an array of 7×7 tips 7. It should be understood, though, that the soft pole piece 2 can be formed in much larger arrays of tips 7. The same apparatus 1 may then be used to make smaller ball grid arrays depending on the desired substrate size and number of pads attached thereto. As shown in FIG. 7, this can be accomplished by placing a mask 22 over the undesired tips 7 before the ball application step of the process. The mask 22 is placed over the undesired area of tips 7 thus exposing only a smaller matrix, for example, 4×4 in either the center as shown here or in any other area of the array of the apparatus 1. Multiple ball grid arrays could also be formed in a single operation if the array of tips 7 is large enough to accept multiple substrates of a desired size. The method of attaching balls 14 to this smaller substrate or to multiple substrates can then be carried out per the steps described above.

An advantage of this apparatus 1 is that both the positioning and reflowing steps of the ball application process can be accomplished using this apparatus 1. This apparatus 1 performs mass accurate alignment and soldering which results in better solder connections between the balls 14 and the pads 19 of a substrate 16 due to the rapid and localized heating of the balls 14. An additional advantage is that the localized heating minimizes any risk of substrate 16 warpage due to excessive heating, and also minimizes the risk of damage to any components or devices on the substrate 16. An additional advantage is that higher temperatures for soldering as well as brazing balls 14 to the substrate pads 19 are possible because of the localized heating which does not spread to the substrate 16 with the potential for damage to the substrate 16 or the components. The substrate 16 essentially remains at room temperature and does not approach temperatures exceeding its normal operating temperature. An additional advantage is that since a single apparatus 1 is used in the ball application process, production time may be reduced and thus throughput increased.

I claim:

1. An apparatus for attaching balls to a substrate comprising:
    a first pole piece having a main body, tapered sections extending therefrom and tips extending from the tapered sections;
    an insulative base plate having a plurality of openings, disposed over the tapered sections such that the tips pass through corresponding openings in the insulative base plate;
    an alignment plate having a plurality of ball receiving openings, disposed over the insulative base plate such that the tips are aligned with corresponding ball receiving openings in the alignment plate;
    a magnetizing member disposed on a periphery of the main body;
    a second pole piece having a receiving area for receiving the first pole piece; and
    a high frequency excitation member in communication with the second pole piece.

2. The apparatus as recited in claim 1 wherein the first pole piece is formed of ferrite.

3. The apparatus as recited in claim 1 wherein the ball receiving openings of the alignment plate have a larger diameter than balls to be received therein.

4. The apparatus as recited in claim 1 wherein the second pole piece is formed of a ferrite material.

5. The apparatus as recited in claim 2 wherein the magnetizing member is a coil which is wrapped around the periphery of the main body.

6. The apparatus as recited in claim 2 wherein the magnetizing member is a magnet which is in contact with the main body.

7. The apparatus as recited in claim 1 wherein the high frequency excitation member is a coil wrapped around the periphery of the second pole piece.

8. An apparatus for attaching balls to a substrate comprising:
    a first pole piece having a main body, and tips extending therefrom;
    an alignment member having a plurality of openings, disposed over the tips such that the tips partially pass through the openings;

a magnetizing member disposed on a periphery of the main body;

a second pole piece having a receiving area for receiving the first pole piece; and an excitation member in communication with the second pole piece.

9. The apparatus as recited in claim 8 wherein the alignment member further comprises:

an insulative base plate having a plurality of openings, disposed over the tips such that the tips pass through corresponding openings in the insulative base plate; and an alignment plate having a plurality of openings, disposed over the insulative base plate such that the tips partially pass through corresponding openings in the alignment plate.

10. The apparatus as recited in claim 8 wherein the first pole piece is formed of ferrite.

11. The apparatus as recited in claim 9 wherein the ball receiving openings of the alignment plate have a larger diameter than balls to be received therein.

12. The apparatus as recited in claim 8 wherein the second pole piece is formed of a ferrite material.

13. The apparatus as recited in claim 10 wherein the magnetizing member is a coil which is wrapped around the periphery of the main body.

14. The apparatus as recited in claim 8 wherein the magnetizing member is a magnet which is in contact with the main body.

15. The apparatus as recited in claim 8 wherein the excitation member is a coil wrapped around the periphery of the second pole piece.

16. A method of attaching balls to a substrate comprising the steps of:

providing a plurality of balls;

spreading a plurality of balls over ball receiving openings;

magnetically attracting the balls into the ball receiving openings;

removing excess balls that have not been attracted into a ball receiving opening;

placing a substrate having pre fluxed and pre soldered pads in contact with the balls such that each of the balls are positioned to correspond with a respective pad on the substrate;

heating the balls very quickly and in a localized manner; and allowing the substrate and ball assembly to cool.

17. The method of attaching balls to a substrate as recited in claim 16 wherein the balls are spread over the substrate by vibrating.

18. The method of attaching balls to a substrate as recited in claim 16 wherein the balls are magnetically attracted into the ball receiving opening by a magnet.

19. The method of attaching balls to a substrate as recited in claim 16 wherein the balls are magnetically attracted into the ball receiving opening by an electromagnet consisting of a magnetizing coil and a pole piece.

20. The method of attaching balls to a substrate as recited in claim 16 wherein the excess balls are removed by blowing air over the ball receiving openings.

21. The method of attaching balls to a substrate as recited in claim 16 wherein the excess balls are removed by sweeping.

22. The method of attaching balls to a substrate as recited in claim 16 wherein the excess balls are removed by rotating the first pole piece such that the ball receiving openings are tilted away from a horizontal position.

23. The method of attaching balls to a substrate as recited in claim 16 wherein the balls are heated by induction of eddy currents.

24. The method of attaching balls to a substrate as recited in claim 22 wherein the eddy currents are induced by a high frequency excitation member in cooperation with a pole piece which is in communication with the balls in the ball receiving openings.

* * * * *